United States Patent [19]

Kotzamanis

[11] Patent Number: 5,999,046
[45] Date of Patent: Dec. 7, 1999

[54] POWER COMBINER FOR USE IN A RADIO FREQUENCY SYSTEM AND A METHOD OF CONSTRUCTING A POWER COMBINER

[75] Inventor: George Kotzamanis, Schaumburg, Ill.

[73] Assignee: Motorola, Inc., Schaumburg, Ill.

[21] Appl. No.: 09/095,670

[22] Filed: Jun. 10, 1998

[51] Int. Cl.[6] .................................................. H03F 3/68
[52] U.S. Cl. ................................. 330/124 R; 330/124 D
[58] Field of Search ........................... 330/124 R, 124 D, 330/295, 302, 53, 286

[56] References Cited

U.S. PATENT DOCUMENTS

| | | | |
|---|---|---|---|
| 3,963,993 | 6/1976 | Hoffman et al. | 330/124 R |
| 4,064,464 | 12/1977 | Morse | 330/53 |
| 4,068,228 | 1/1978 | Vallas | 340/347 |
| 5,543,751 | 8/1996 | Stedman et al. | |
| 5,786,727 | 7/1998 | Sigmon | 330/124 R |
| 5,867,060 | 2/1999 | Burkett, Jr. et al. | 330/2 |

*Primary Examiner*—Robert Pascal
*Assistant Examiner*—Henry Choe
*Attorney, Agent, or Firm*—Kenneth A. Haas

[57] ABSTRACT

A power combiner including a plurality of phasing transmission lines (122) supporting a set of amplifiers (103–105) coupled thereto, and a plurality of matching transmission lines (123–124). The set of amplifiers (103–105) have a selectable number of amplifiers between a minimum and a maximum value having gain levels between a minimum and a maximum value. Each of the matching transmission lines (123–124) is coupled to one of the phasing transmission lines (122) at one end and coupled to a common node (126) at the other end. Each of the matching transmission (123–124) lines has a characteristic impedance determined according to a function of the minimum and the maximum number of amplifiers in the set of amplifiers (103–105) and the minimum and maximum gain levels in the set of amplifiers (103–105).

10 Claims, 2 Drawing Sheets

POWER COMBINER FOR USE IN A RADIO FREQUENCY SYSTEM AND A METHOD OF CONSTRUCTING A POWER COMBINER

FIELD OF THE INVENTION

The present invention relates generally to radio frequency systems and, more particularly, to power combiners for use in a radio frequency system.

BACKGROUND OF THE INVENTION

Extended linear power amplifier systems have been proposed for use in cellular base stations. These systems include a number of linear power amplifier modules producing a corresponding number of output signals that need to be combined into a single high power signal before transmission. Such systems are typically used in communication systems such as in a base site of a radiotelephone system. In such systems, it is desirable that the number of linear power amplifier modules may be any number from a minimum number up to a maximum number of allowable amplifiers. In this manner, the amount of power output by the transmission unit of the base station may be adjusted by selecting the number of amplifiers to be used. In addition, it is desirable that the system provides adequate power amplification efficiency across the entire range of selected amplifiers, i.e. from the minimum number to the maximum number of amplifiers and that dissipations in the amplifiers due to reflected output power be kept to a minimum, particularly when the system contains a maximum of amplifiers.

However, conventional power combiners, such as Wilkinson type combiners, are only efficient when all of the available amplifiers are present, and rapidly become less efficient due to impedance mismatch and resistive circuit elements when less than the maximum number of amplifiers are selected. For example, a Wilkinson type 10:1 combiner will only be 10% efficient when a single amplifier is coupled to the combiner. This poor efficiency at less than maximum amplification is undesirable for extended linear amplifier applications A proposed device for addressing this problem is described in U.S. Pat. No. 5,543,751, by Stedman et al., and incorporated by reference herein. Stedman et al. describes a power combiner having matching transmission lines of substantially equivalent length of one-quarter of a wavelength, and a characteristic impedance determined according to a function of the minimum and the maximum number of amplifiers in the set of amplifiers. Although the Stedman et al. patent does solve the above-mentioned problem, the solution results in a high level of reflected power to the amplifiers particularly when the maximum number of unequal gain amplifiers are used. This condition results in undesirable heating in the power amplifiers.

Accordingly, there is a need for an improved power combiner that maintains a high efficiency across the entire range of amplifiers having differing gain values, that may be coupled to the combiner without degrading the useful bandwidth of the combiner and minimizes heating in the power amplifiers due to reflection created by the combining a maximum quantity of unequal gain amplifiers.

DETAILED DESCRIPTION OF THE PREFERRED EMBODIMENTS

Figure 1:
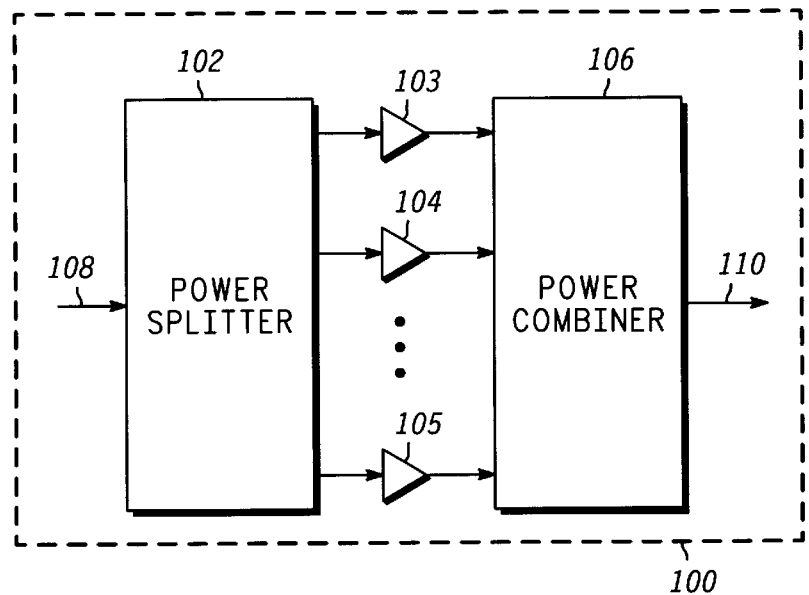
FIG. 1 is a block diagram of a radio frequency circuit with a splitter and power combiner according to the preferred embodiment of the present invention.

To overcome the problems described above a power splitter and combiner is provided including a plurality of phasing transmission lines supporting a set of amplifiers coupled thereto, and a plurality of matching transmission lines. The set of amplifiers have a selectable number of amplifiers between a minimum and a maximum value having gain levels between a minimum and a maximum value. Each of the matching transmission lines is coupled to one of the phasing transmission lines at one end and coupled to a common node at the other end. Each of the matching transmission lines has a characteristic impedance determined according to a function of the minimum and the maximum number of amplifiers in the set of amplifiers and the minimum and maximum gain levels in the set of amplifiers. The preferred embodiment of the present invention results in lowered heating of the power amplifiers due to reflected power where the maximum number of amplifiers are used.

The power combiner comprises a plurality of phasing transmission lines supporting a set of amplifiers coupled thereto with the set of amplifiers including a first and a second amplifier of differing gain values, and having a minimum and a maximum selectable number of amplifiers. The power combiner additionally comprises a plurality of matching transmission lines, each of the matching transmission lines has a first and second end with the first end coupled to one of the phasing lines and the second end coupled to a common node. Each matching transmission line has a substantially equivalent characteristic impedance determined according to a function of the minimum and maximum selectable number of amplifiers and the differing gain values.

The preferred embodiment additionally includes a method of constructing a power combiner for use in a radio frequency system. The method comprises the steps of providing a plurality of parallel phasing transmission lines supporting a set of amplifiers coupled thereto, with the set of amplifiers including a first and a second amplifier of differing gain values, and having a minimum and a maximum selectable number of amplifiers. Next, a plurality of matching transmission lines are provided, each of the matching transmission lines has a first and a second end, the first end coupled to one of the phasing lines and the second end coupled to a common node. Each of the matching transmission lines has a substantially equivalent characteristic impedance determined according to a nonlinear function of the minimum and the maximum selectable number of amplifiers and the differing gain values.

Finally, the preferred embodiment encompasses an apparatus comprising a power splitter coupled to a plurality of amplifiers having a minimum and a maximum selectable number of amplifiers, and including a first and a second amplifier of differing gain values. The power splitter comprises a plurality of phasing transmission lines coupled to the plurality of amplifiers and a plurality of matching transmission lines. Each of the matching transmission lines has a first and a second end, the first end coupled to one of the phasing lines and the second end coupled to a common node. Additionally, each of the matching transmission lines has a substantially equivalent characteristic impedance determined according to a nonlinear function of the minimum and the maximum selectable number of amplifiers and the differing gain values.

Referring now to FIG. 1, a radio frequency (the "RF") amplifier circuit including a power splitter and power combiner 100 is illustrated. In the preferred embodiment of the present invention, splitter and combiner 100 is utilized in a cellular radio telephone system base station, however, one of ordinary skill in the art will recognize that splitter and combiner 100 may be utilized in any system requiring a number of linear power amplifier modules producing a number of output signals that need to be combined into a single high power signal. The power splitter and power combiner circuit 100 includes a power splitter circuit 102, a set of amplifiers 103–105, and a power combiner 106. Unlike the prior art solution, in the preferred embodiment of the present invention, amplifiers 103–105 have differing gain values. The power splitter 102 receives an input signal 108 that is to be split into a plurality of output signals. The plurality of output signals from the power splitter 102 are fed into individual power amplifiers within the set of power amplifiers 103–105. The output of the power amplifiers 103–105 are each fed into the power combiner 106. The combiner 106 receives each of the outputs from the set of amplifiers 103–105 and produces an output signal 110. In the preferred embodiment, the power splitter 102 is coupled to the set of amplifiers 103–105, which in turn are coupled to the power combiner 106.

Figure 2:
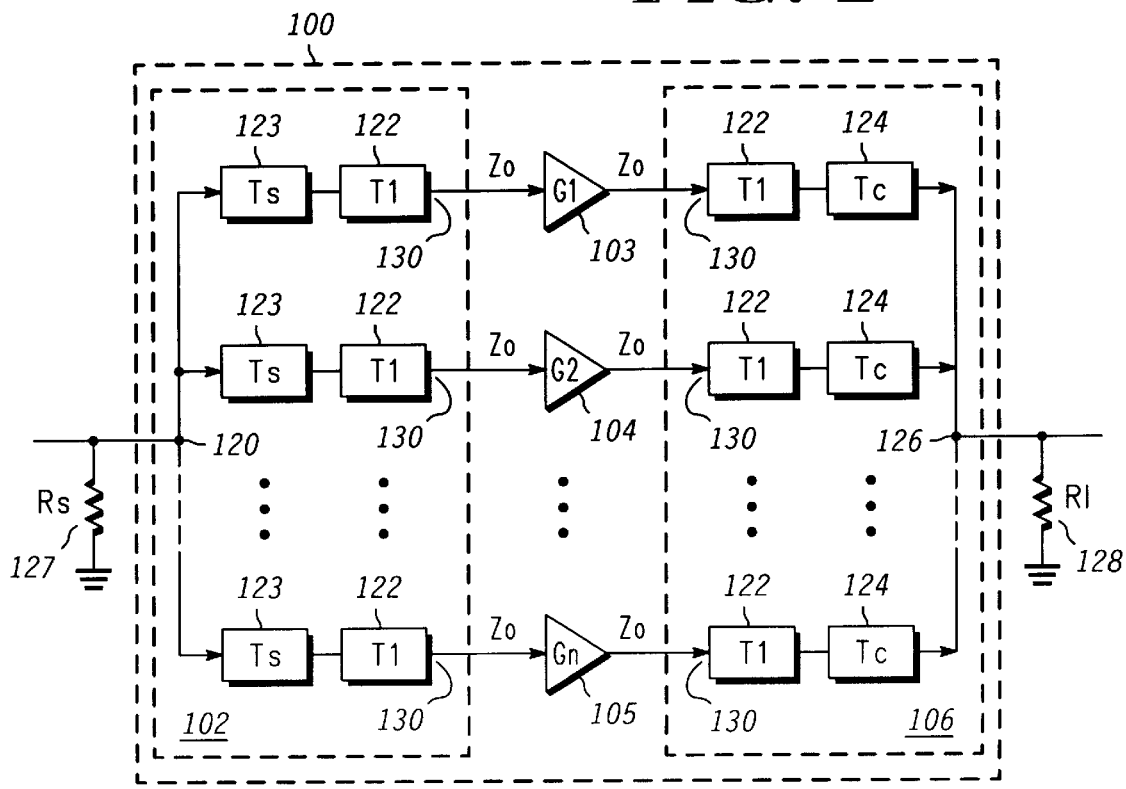
FIG. 2 is a more detailed block diagram of a radio frequency circuit with a splitter and power combiner according to the preferred embodiment of the present invention.

Referring to FIG. 2, a more detailed view of the splitter and power combiner 100 of FIG. 1 is shown. Both the power splitter 102 and the power combiner 106 include a plurality of phasing transmission lines 122, a plurality of matching transmission lines 123–124, a common node 126, an input load (Rs) 127, an output load (R1) 128, and a set of nodes 130. The set of nodes 130 are each coupled to an amplifier within the set of amplifiers 103–105. Each of the phasing transmission lines 122 is connected to one of the nodes 130 at one end and is connected to one of the matching transition lines 123–124 at the other end. Transmission lines 122 located within splitter 102 have a characteristic impedance that is substantially equivalent to load 127, and transmission lines 122 located within combiner 106 have an impedance substantially equivalent to load 128. Also, each of the phasing transmission lines 122 has a length which is equal to one quarter of a wavelength (¼λ) or an odd multiple thereof.

Each of the matching transmission lines 123–124 is connected to the common node 126. In addition, each of the matching transmission lines 123–124 has a length which is equal to ¼λ. Further, each matching transmission line 123–124 has a characteristic impedance ($Z_{Ts}$ and $Z_{Tc}$, respectively) determined according to a function of the minimum and maximum number of amplifiers in the set of amplifiers 103–105 and a function of the differing gain values. More particularly, the characteristic impedance is determined inter alia, according to a minimum and maximum gain of the amplifiers 103–105, where:

$$Z_{Tc} = Z_o \sqrt{\frac{1}{Y_{out}}} \text{ and}$$

$$Z_{Ts} = Z_o \sqrt{mnY_{out}}$$

m=the maximum number of amplifiers to be used, n=the minimum number of amplifiers to be used, and $$Y_{out} = \frac{-b - \sqrt{b^2 - 4a}}{2a}$$

where $$a = mn\left(1 - \frac{Gr^2 + 1}{Gr}\right) + m\left(\frac{1}{Gr} - 1\right) + n(Gr - 1)$$

$$b = m(1 - Gr) + n\left(1 - \frac{1}{Gr}\right) + \frac{Gr^2 + 1}{Gr} - 2,$$

and
Gr=the ratio of the maximum power amplifier gain (Gmax) in the set of amplifiers 103–105 to the minimum power amplifier gain (Gmin) in the set of amplifiers 103–105 (i.e.,Gmax/Gmin).

Figure 3:
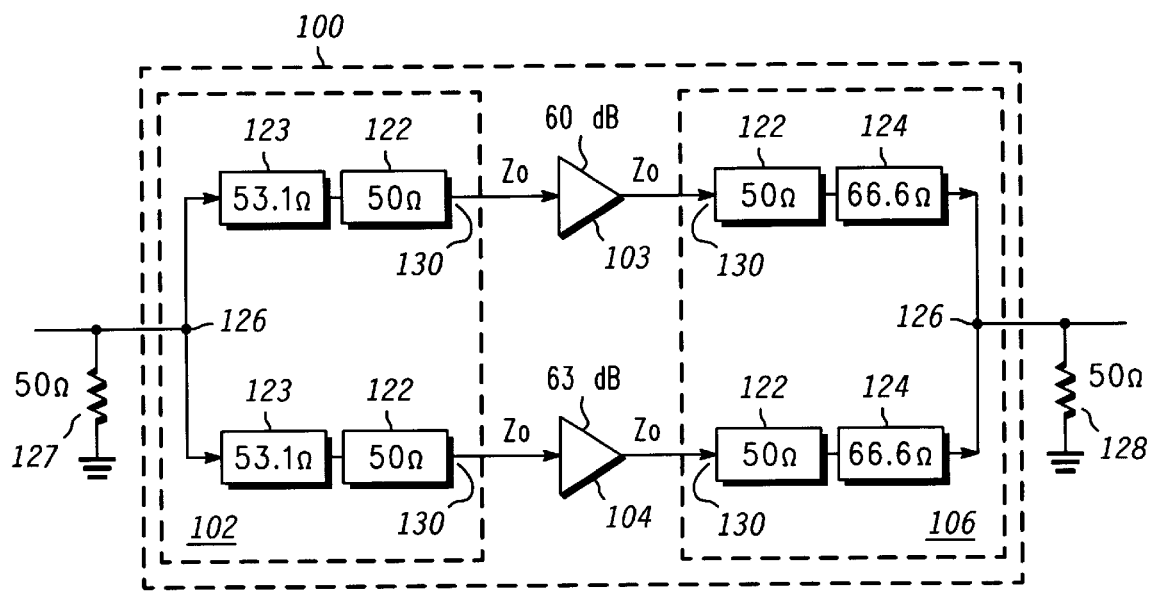
FIG. 3 is a block diagram of the circuit of FIG. 1 having two amplifiers of unequal gain.

Referring to FIG. 3, an example of a power combiner 100 is shown having two amplifiers of unequal gain. In this example the amplifier set 123–124 consists of a maximum of two amplifiers and a minimum of one amplifier. The maximum gain of any amplifier in the set 123–124 is 63dB ($\sqrt{2} \times 10^3$) and the minimum is 60 dB ($1 \times 10^3$).
Thus: m=2
n=1
Rs=R1=Zo=50Ω
Gr=($\sqrt{2} \times 10^3$)/($1 \times 10^3$)=$\sqrt{2}$
a=−2.4142 b=−0.4142
$Y_{out}$=0.5635
$Z_{Tc}$=66.6Ω $Z_{Ts}$=53.1Ω

The following Table 1 shows the results of a simulation of the entire matrix of possible combinations for the example in FIG. 3 to the prior art (Stedman et al.) and a theoretical ideal adaptive combiner that adapts itself to each case for maximum gain. (Note that because of network symmetry case 6 (with amplifier 103=63 dB and amplifier 104=60 dB) is identical to Case 5, and thus is omitted from Table 1.)

TABLE 1

| | GAIN (dB) | | | | |
|---|---|---|---|---|---|
| | Amplifier | | Network | | |
| Case | 103 | 104 | Ideal | Prior Art | Preferred Embodiment |
| 1 | 60 | None | 60.00 | 59.74 | 59.63 |
| 2 | 63 | None | 63.00 | 62.74 | 62.63 |
| 3 | 60 | 60 | 60.00 | 59.74 | 59.63 |
| 4 | 63 | 63 | 63.00 | 62.74 | 62.63 |
| 5 | 60 | 63 | 61.73 | 61.37 | 61.26 |

The following Table 2 shows a simulation of the heating of each power amplifier in relation to the power amplifiers contribution to the total output power for the entire matrix of possible combinations of the example in FIG. 3 to the prior art. The amplifiers of each case are as described in Table 1.

TABLE 2

| | Relative Reflected Power, % | | | |
|---|---|---|---|---|
| | Prior Art | | Preferred Embodiment | |
| Case | 103 | 104 | 103 | 104 |
| 1 | 3.0 | NA | 8.4 | NA |
| 2 | 3.0 | NA | 8.4 | NA |

TABLE 2-continued

| | Relative Reflected Power, % | | | |
| --- | --- | --- | --- | --- |
| | Prior Art | | Preferred Embodiment | |
| Case | 103 | 104 | 103 | 104 |
| 3 | 3.0 | 3.0 | 0.3 | 0.3 |
| 4 | 3.0 | 3.0 | 0.3 | 0.3 |
| 5 | 18.0 | 4.9 | 8.0 | 0.0 |

As is evident, the preferred embodiment of the present invention results in lowered heating of the power amplifiers due to reflected power for Cases 3, 4 and 5 where the maximum (two in this example) amplifiers are used. Accordingly, the preferred embodiment results in an improved power combiner that maintains a high efficiency across the entire range of amplifiers having differing gain values, and minimizes heating in the power amplifiers due to reflection created by the combining a maximum quantity of unequal gain amplifiers.

While the Invention has been particularly shown and described with reference to a particular embodiment, it will be understood by those skilled in the art that various changes in form and details may be made therein without departing from the spirit and scope of the Invention, and it is intended that such changes come within the scope of the following claims and their equivalents.

What is claimed is:

1. A power combiner comprising:
   a plurality of phasing transmission lines supporting a set of amplifiers coupled thereto with the set of amplifiers including a first and a second amplifier of substantially differing gain values, and having a minimum and a maximum selectable number of amplifiers; and
   a plurality of matching transmission lines, each of the matching transmission lines having a first and second end, the first end coupled to one of the phasing lines and the second end coupled to a common node and each matching transmission line having a substantially equivalent characteristic impedance determined according to a function of the minimum and maximum selectable number of amplifiers and the substantially differing gain values.

2. The power combiner of claim 1 wherein each of the phasing transmission lines has a length of a quarter of a wavelength.

3. The power combiner of claim 2 wherein the length comprises an odd multiple of a quarter of a wavelength.

4. The power combiner of claim 1 wherein the function comprises a ratio of a maximum power amplifier gain (Gmax) in the set of amplifiers to a minimum power amplifier gain (Gmin) in the set of amplifiers.

5. The power combiner of claim 1 wherein the matching transmission lines each have a length which is a multiple of one fourth of a wavelength.

6. A method of constructing a power combiner for use in a radio frequency system, the method comprising the steps of:
   providing a plurality of parallel phasing transmission lines supporting a set of amplifiers coupled thereto, with the set of amplifiers including a first and a second amplifier of substantially differing gain values, and having a minimum and a maximum selectable number of amplifiers;
   providing a plurality of matching transmission lines, each of the matching transmission lines having a first and a second end, the first end coupled to one of the phasing lines and the second end coupled to a common node, and each of the matching transmission lines having a substantially equivalent characteristic impedance; and
   determining the characteristic impedance according to a nonlinear function of the minimum and the maximum selectable number of amplifiers and the substantially differing gain values.

7. The method of claim 6 wherein the step of determining comprises the step of determining the characteristic impedance according to a nonlinear function comprising a ratio of a maximum power amplifier gain (Gmax) in the set of amplifiers to a minimum power amplifier gain (Gmin) in the set of amplifiers.

8. The method of claim 6 wherein the step of providing the plurality of matching transmission lines comprises the step of providing the plurality of matching transmission lines within a base site of a radio telephone system.

9. An apparatus comprising:
   a power splitter coupled to a plurality of amplifiers having a minimum and a maximum selectable number of amplifiers, and including a first and a second amplifier of substantially differing gain values, the power splitter comprising:
     a plurality of phasing transmission lines coupled to the plurality of amplifiers; and
     a plurality of matching transmission lines each of the matching transmission lines having a first and a second end, the first end coupled to one of the phasing lines and the second end coupled to a common node, and each of the matching transmission lines having a substantially equivalent characteristic impedance determined according to a nonlinear function of the minimum and the maximum selectable number of amplifiers and the substantially differing gain values.

10. The apparatus of claim 9 further comprising:
    a power combiner coupled to the plurality of amplifiers, the power combiner comprising:
      a plurality of phasing transmission lines coupled to the plurality of amplifiers; and
      a plurality of matching transmission lines each of the matching transmission lines having a first and a second end, the first end coupled to one of the phasing lines and the second end coupled to a common node, and each of the matching transmission lines having a substantially equivalent characteristic impedance determined according to a nonlinear function of the minimum and the maximum selectable number of amplifiers and the differing gain values.

* * * * *